(12) United States Patent
Deng et al.

(10) Patent No.: US 6,440,617 B1
(45) Date of Patent: Aug. 27, 2002

(54) PHOTOMASK STRUCTURE

(75) Inventors: Erwin Deng, Hsintien; Sylvia Hwang, Taoyuan Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 70 days.

(21) Appl. No.: 09/680,781

(22) Filed: Oct. 6, 2000

(30) Foreign Application Priority Data

Sep. 29, 2000 (TW) ........................................ 89120196 A

(51) Int. Cl.$^7$ ................................................. G03F 9/00
(52) U.S. Cl. ............................................... 430/5; 428/14
(58) Field of Search .............................. 430/5; 428/14; 206/316.1, 706, 710

(56) References Cited

U.S. PATENT DOCUMENTS 5,691,088 A * 11/1997 Kubota et al. ................. 430/5
6,337,161 B2 * 1/2002 Chiba et al. ................... 430/5

* cited by examiner

Primary Examiner—S. Rosasco
(74) Attorney, Agent, or Firm—J.C. Patents

(57) ABSTRACT

A photomask structure with an anti-electrostatic-discharge (Anti-ESD) ability. The photomask structure comprises a photomask, a conductive dust pellicle, a conductive frame and a conductive film. The photomask possesses a first surface and a pattern is located on the first surface. The conductive dust pellicle is coupled with the photomask through the conductive frame and the pattern is enclosed by the conductive dust pellicle, the conductive frame and the photomask. The conductive film covers a surface of the photomask uncovered by the conductive dust pellicle and the conductive frame. The conductive dust pellicle, the conductive frame and the conductive film constitute a conductive structure enclosing the photomask.

16 Claims, 1 Drawing Sheet

PHOTOMASK STRUCTURE

CROSS-REFERENCE TO RELATED APPLICATION

This application claims the priority benefit of Taiwan application serial no. 89120196, filed Sep. 29, 2000.

BACKGROUND OF THE INVENTION

1. Field of Invention

The present invention relates to a photomask structure. More particularly, the present invention relates to a photomask structure with an anti-electrostatic-discharge (Anti-ESD) ability.

2. Description of Related Art

Typically, the semiconductor process comprises four modules including the diffusion module, the etching module, the thin film module and the photo module. The photo module, in which the photolithography process is performed, is used to replicate the etching patterns for the etching module or implanting patterns for the thin film module on the photomask onto the wafer. Hence, the quality of the semiconductor device depends on whether the resolution of the photolithography process is good.

Currently, the photomask is formed of an insulating material such as quartz and surface covering materials such as Cr and MoSi. While the photomask is situated under an unexpected applied electric field, the patterns on the photomask are polarized easily.

However, with the increasing of the integration of the integrated circuit, the density of the pattern on the photomask is increased and the pitches of the bit line and the word line, and even the diffusion region and the capacitance, are decreased. Hence, the charges accumulating on the patterns because of the polarization will be easy to discharge as an electrostatic discharge effect while the space between the patterns is getting smaller and smaller.

Since the electrostatic discharge happens with emitting heat and energy, the local metal patterns on the photomask where ESD happens are melted and distorted by the high temperature. Therefore, the exposure result is worse.

SUMMARY OF THE INVENTION

The invention provides a photomask structure with an anti-electrostatic-discharge (Anti-ESD) ability. The photomask structure comprises a photomask, a conductive dust pellicle, a conductive frame and a conductive film. The photomask possesses a first surface and a pattern is located on the first surface. The conductive dust pellicle is coupled with the photomask through the conductive frame and the pattern is enclosed by the conductive dust pellicle, the conductive frame and the photomask. The conductive film covers the surface of the photomask uncovered by the conductive dust pellicle and the conductive frame. The conductive dust pellicle, the conductive frame and the conductive film constitute an entire conductive structure enclosing the surface of the photomask.

According to the Gauss law, the charges only distribute on the surface of a conductor and the object and the space inside the conductor will not be affected by the applied electric field and applied charges. The theorem indicates that a closed conductive shell can provide a shielding effect so that polarization effect happens only on the surface of the closed conductive shell such as the conductive structure covering the surface of the photomask while the photomask structure is located under an applied electric field. The conductive structure can protect the patterns on the photomask from being polarized by the applied electric field and the applied charges. Hence, the electrostatic-discharge problem can be overcome no matter how high the integration is and how dense the pattern is.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
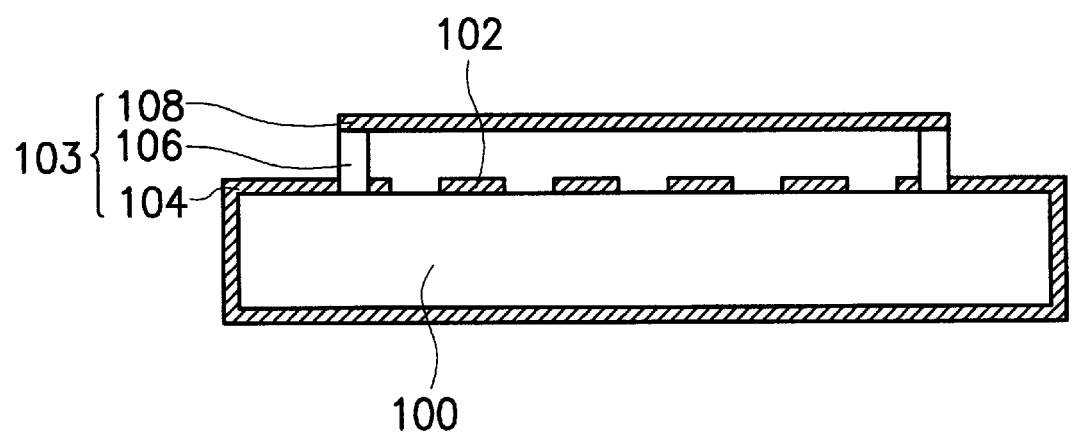
FIG. 1 is a photomask structure with an anti-electrostatic-discharge ability according to one preferred embodiment of this invention.

FIG. 1 is a photomask structure with an anti-electrostatic-discharge ability according to one preferred embodiment of this invention.

The photomask structure comprises a photomask 100. The photomask possesses a pattern 102 formed on one side of the photomask 100. The photomask 100 can be formed of quartz and the pattern 102 can be made of chromium.

The photomask 100 and the pattern 102 are enclosed by a conductive structure 103. The conductive structure 103 comprises a conductive dust pellicle 108, a conductive frame 106 and a conductive film 104.

The conductive dust pellicle 108 and the photomask 100 are coupled with each other through the conductive frame 106. The conductive dust pellicle 108 and the conductive frame 106 enclose the pattern 102 and isolate the pattern 102 from the outside in order to prevent the pattern 102 from being contaminated by the dust and the particles. The conductive dust pellicle 108 is formed of a material with a conductive and high transparent ability. Preferably, the conductive dust pellicle 108 can be polymer.

The conductive film 104 covers a portion of the surface of the photomask 100 uncovered by the conductive dust pellicle 108 and the conductive frame 106. The conductive dust pellicle 108, the conductive frame 106 and the conductive film 104 constitute the conductive structure 103 enclosing the photomask 100 and the pattern 102.

According to the Gauss law, the charges merely distribute on the surface of a conductor and the object and the space inside the conductor will not be affected by the applied electric field and applied charges. Therefore, the polarization effect happens only on the conductive structure 103 enclosing the photomask 100 and the pattern 102 while the photomask structure is located under an applied electric field. The conductive structure 103 creates a shielding effect to protect the photomask 100 and the pattern 102 from being polarized by the applied electric field and the applied charges. Hence, the electrostatic-discharge (ESD) problem can be overcome no matter how high the integration is and how dense the pattern is.

It will be apparent to those skilled in the art that various modifications and variations can be made to the structure of the present invention without departing from the scope or spirit of the invention. in view of the foregoing, it is intended that the present invention cover modifications and variations of this invention provided they fall within the scope of the following claims and their equivalents.

What is claimed is:

1. A photomask structure with an anti-electrostatic-discharge ability, comprising:
   a photomask having a first surface, wherein a pattern is located on the first surface;
   a conductive dust pellicle;
   a conductive frame, wherein the conductive dust pellicle is electrically coupled with the photomask through the conductive frame and the pattern is enclosed by the conductive dust pellicle, the conductive frame and the photomask; and
   a conductive film covering a surface of the photomask uncovered by the conductive dust pellicle and the conductive frame, wherein the conductive dust pellicle, the conductive frame and the conductive film constitute a conductive structure enclosing the photomask.

2. The photomask structure with an anti-electrostatic-discharge ability of claim 1, wherein the conductive dust pellicle is formed of a material with a conductive and high transparent ability.

3. The photomask structure with an anti-electrostatic-discharge ability of claim 2, wherein the conductive dust pellicle is formed of polymer.

4. The photomask structure with an anti-electrostatic-discharge ability of claim 1, wherein the conductive frame is formed of a material with a conductive ability.

5. The photomask structure with an anti-electrostatic-discharge ability of claim 4, wherein the conductive frame is formed of polymer.

6. The photomask structure with an anti-electrostatic-discharge ability of claim 1, wherein the conductive frame includes an insulating frame coated with a conductive material.

7. The photomask structure with an anti-electrostatic-discharge ability of claim 1, wherein the conductive film is formed of a material with a conductive and high transparent ability.

8. The photomask structure with an anti-electrostatic-discharge ability of claim 1, wherein the conductive film is formed of a gilding material with a conductive and high transparent ability.

9. A photomask structure with an anti-electrostatic-discharge ability, comprising:
   a photomask having a first surface, wherein a pattern is located on the first surface; and
   a closed conductive structure enclosing the photomask, wherein the conductive structure comprises:
      a conductive frame;
      a conductive dust pellicle electrically coupled with the photomask through the conductive frame, wherein the pattern is enclosed by the conductive dust pellicle, the conductive frame and the photomask; and
      a conductive film enclosing the photomask exposed by the conductive dust pellicle and the conductive frame.

10. The photomask structure with an anti-electrostatic-discharge ability of claim 9, wherein the conductive dust pellicle is formed of a material with a conductive and high transparent ability.

11. The photomask structure with an anti-electrostatic-discharge ability of claim 10, wherein the conductive dust pellicle is formed of polymer.

12. The photomask structure with an anti-electrostatic-discharge ability of claim 9, wherein the conductive frame is formed of a material with a conductive ability.

13. The photomask structure with an anti-electrostatic-discharge ability of claim 12, wherein the conductive frame is formed of polymer.

14. The photomask structure with an anti-electrostatic-discharge ability of claim 9, wherein the conductive frame includes an insulating frame coated with a conductive material.

15. The photomask structure with an anti-electrostatic-discharge ability of claim 9, wherein the conductive film is formed of a material with a conductive and high transparent ability.

16. The photomask structure with an anti-electrostatic-discharge ability of claim 9, wherein the conductive film is formed of a gilding material with a conductive and high transparent ability.

* * * * *